United States Patent [19]

Itagaki et al.

[11] Patent Number: 4,704,792
[45] Date of Patent: Nov. 10, 1987

[54] COMPONENTS FEEDING APPARATUS

[75] Inventors: Masato Itagaki, Shimizu; Katsuaki Kikuchi, Tsuchiura; Susumu Nakayama, Shizuoka; Yoshio Haeda, Yaizu; Takashi Kawakami, Shimizu, all of Japan

[73] Assignee: Hitachi, Ltd., Tokyo, Japan

[21] Appl. No.: 853,178

[22] Filed: Apr. 17, 1986

[30] Foreign Application Priority Data

Apr. 17, 1985 [JP] Japan ................................. 60-80101

[51] Int. Cl.$^4$ .............................................. B23P 19/00
[52] U.S. Cl. .......................................... 29/741; 29/739; 29/809; 29/744; 414/222; 414/416; 198/619
[58] Field of Search ................. 29/739, 740, 741, 744, 29/809, 564.1; 414/222, 416; 198/346.1, 619; 104/290, 292

[56] References Cited

U.S. PATENT DOCUMENTS

| 4,166,316 | 9/1979 | Misawa et al. | 29/739 |
| 4,307,832 | 12/1981 | Taki et al. | 228/5.1 |
| 4,598,459 | 7/1986 | Klink et al. | 29/741 |

FOREIGN PATENT DOCUMENTS 3424323  1/1985  Fed. Rep. of Germany ........ 29/740

Primary Examiner—P. W. Echols
Attorney, Agent, or Firm—Antonelli, Terry & Wands

[57] ABSTRACT

In an electronic component mounting apparatus comprises a component feeding section including a feeding table unit loaded with several types of electronic components which feeding table unit is adapted to laterally reciprocate on a base, and stopping at a predetermined position thereby to feed the components continuously to a transfer mechanism, the transfer mechanism for absorbing the electronic components and mounting them on a board on an X-Y table on the other side, the X-Y table fixing and stopping the board to a predetermined position, and a board transport section for transporting the board onto the X-Y table for delivering the board having the electronic components mounted thereon, a component feeding apparatus wherein the component feeding table unit of the component feeding section is divided into a plurality of feeding tables each adapted to be moved individually on a straight line by a drive mechanism, the apparatus further comprising means for moving the table to a predetermined position in opposed relationship with the transfer mechanism in resonse to a command from the control unit.

7 Claims, 8 Drawing Figures

COMPONENTS FEEDING APPARATUS

BACKGROUND OF THE INVENTION

The present invention relates to a components feeding apparatus for mounting a multiplicity of types of small components in position on a board at high speed, or more in particularly to a components feeding apparatus for a components mounting machine for mounting a multiplicity of types of very small electronic components stored in a tape reel on a printed board at high speed.

A conventional electronic components mounting machine or apparatus for mounting a multiplicity of types of very small electronic components on a printed board, as disclosed in the U.S. Pat. No. 4,307,832, is so constructed that an electronic components supply unit is disposed on a components feeding table which is laterally reciprocated and adapted to stop at a predetermined position, and the components feeding table is moved each time a transfer head absorbs an electronic component from the feeding unit.

A plan view of this mechanism is shown in FIG. 7. The electronic component mounting mechanism comprises a body base 1, a components feeding table 2, a transfer mechanism using a rotary head or a rectangular coordinates type robot (in FIG. 7, the mechanism 3 uses a rotary head), and an X-Y table 4. A drive mechanism for the components feeding table 2 includes, as shown in FIG. 8 which is a sectional view along line VIII—VIII of FIG. 7, a linear guide 5 with the components feeding table 2 placed thereon, a rack 7, a pinion 8, a reduction gear 9, and a motor 10 for driving the components feeding table 2 through the reduction gear 9 by the rack 7 and pinion 8. Another type of drive mechanism includes a DC motor or stepping motor for driving a ball screw.

Scores to almost a hundred types of tape reel units accommodating electronic components therein are disposed in parallel to each other on the components feeding table 2. This table 2 is positioned at high speed to place any tape reel accommodation the required electronic components just under an absorption point 3a of the transfer mechanism (example rotary head) 3. In synchronism with the absorption of an electronic component and rotation by the transfer mechanism 3, the X-Y table is positioned so that a predetermined point coated with an adhesive of the printed board may come just under the transfer point 3b of the rotary head 3. Then, the electronic component is transferred to the printed board. These steps of operation are performed continuously at high speed.

In this conventional apparatus, the whole apparatus is stopped to supplement the components whenever the electronic components are depleted on the table. For this type of apparatus which transfers as many as several components per second at high speed, this suspension of operation for set-up is a considerable reduction in the working efficiency.

To the extent that the components handled are about 20 to 40 types, the movable units weigh not more than several tens of kg and the motor capacity not more than 1 KW, it is possible to use a controller with a small capacity in this conventional apparatus. However, with an increase in the transfer speed of up to 0.3 to 0.4 seconds per component, and with an increase in the types of components handled to as many as one thousand, with a corresponding increase in the movable units weight to at least 100 kg, the resultant necessary increase in the capacity of the motor and controller make this apparatus uneconomical. Further, if driven by a ball screw, such an apparatus requires a ball screw as long as several meters, thereby rendering a high-speed drive very difficult in technical aspects of control and vibration.

Furthermore, a heavy item weighing more than 100 kg and moving at high speed, generates a great vibration and noise, resulting in various problems of a reduced mounting performance and a reduced strength of component members for a high-precision mounting apparatus.

SUMMARY OF THE INVENTION

The object of the present invention is to permit the work of supplementing electronic components without suspending the drive of the table engaged in transfer of electronic components.

In order to achieve the above-mentioned object, there is provided according to the present invention a component feeding apparatus comprising a plurality of component feeding tables, a drive mechanism including a linear motor, a transfer mechanism, and means for placing the tables in position in opposed relationship with the transfer mechanism, the feeding tables being drivable individually along the same straight path.

In view of the fact that there are provided a plurality of component feeding tables each drivable and stoppable individually on the same straight path as described above, a table engaged in the transfer of an electronic component is capable of high-speed positioning at high precision, and while the electronic component is being transferred to a board, the remaining tables are kept stationary on both sides of the base, thereby making it possible to supplement parts on the stationary tables during the operation of the apparatus. As a result, the working efficiency can be improved because the apparatus doesn't need to be stopped for refilling the components. Also, with the movable components including a plurality of component feeding tables, only a table engaged in the transfer work is moved to position while the other tables are kept stationary, and therefore it is possible to reduce the weight of the movable components to less than one fourth that with a single table as in the prior art discussed heretofore, thereby reducing the capacity of the drive unit and the control unit.

DESCRIPTION OF THE PREFERRED EMBODIMENTS

Figure 1:
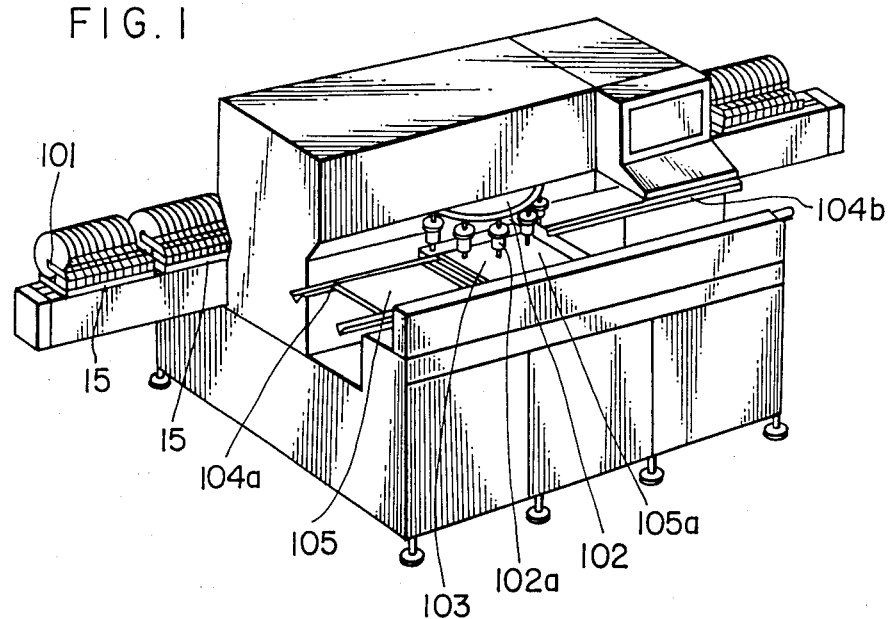
FIG. 1 is a perspective view of a component mounting apparatus comprising a component feeding apparatus according to an embodiment of the present invention.

Referring now to the drawings, FIG. 1 is a perspective view of an electronic component mounting apparatus according to the invention comprising a component feeding unit 101, a transfer mechanism 102, an X-Y table 103, a board receiving section 104a, a board delivery section 104b. The board 105 is unloaded from the board receiving section 104a, fixed on the X-Y table 103, and relatively positioned at a point opposed to a mounting head 102a of the transfer mechanism 102.

Electronic component bearing tapes are fixed on tables 15, The tables 15 with the tapes are movable laterally so that they can be positioned relative to the transfer mechanism 102 at absorption points of the transfer mechanism 102.

The mounting head 102a is lowered and absorbs an electronic component by vacuum, and then makes a half rotation, and is lowered again. Then, the electronic component is mounted in position on the board 105a on the X - Y table 103. This series of work is performed at high speed repetitively.

Figure 2:
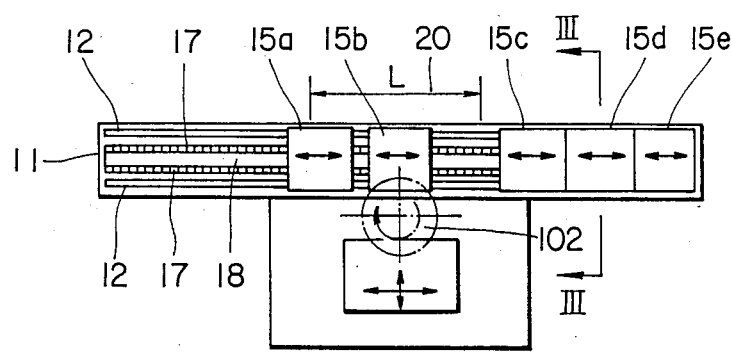
FIG. 2 is a plan view showing a table and a transfer mechanism of the component mounting mechanism of FIG. 1.
Figure 3:
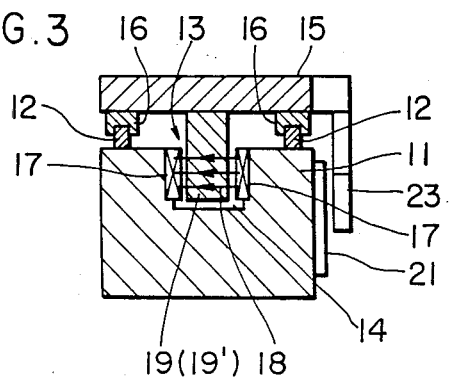
FIG. 3 is an enlarged sectional view taken in line III—III in FIG. 2.

Now, the component feeding table will be explained with reference to FIGS. 2 and 3.

A body base 11, having a length predetermined for allowing the component feeding table to run thereon, includes rail-like linear guides 12 protruded on both sides on the upper surface, and a slot 14 extending substantially over the whole length of the body base for mounting the linear motor 13 at the central part thereof. The component feeding table running on the body base 11 requires a length of about several meters in total if about 100 types of electronic components are to be supplied. The component feeding table is formed by divided tables 15 (15a, 15b, 15c, 15d and 15e). With running members 16 provided on both sides of a lower surface and engaged with the linear guides 12, each table 15 is adapted to run separately on the linear guides 12. The linear motor 13 making up a running (drive) unit includes magnets 17 arranged in opposed relation to the motor on both sides of the slot 14 and a magnetic circuit 18 formed between the magnets 17. A moving part includes a bobbin 19 wound with a coil 19' protruded on the lower surface of the table 15, which bobbin 19 is inserted in the space between the magnets in such a manner that the coil 19' cuts the lines of magnetic force 18. Upon energization of the coil 19', the table 15 runs on the linear guides 12 by magnetic force. The magnets 17 making up the stationary section are arranged over the entire stroke of the body base 11, while the moving parts include a plurality of bobbins 19 of the table 15 arranged on a straight line, sharing the use of the magnets 17 of the stationary section.

Of all the plurality of tables 15a–15e, only the table 15b opposed to the transfer mechanism 102 is positioned by being driven at high accuracy, while the other tables 15a, 15c, 15d and 15e are moved and stopped on the sides of the body base.

Figure 4:
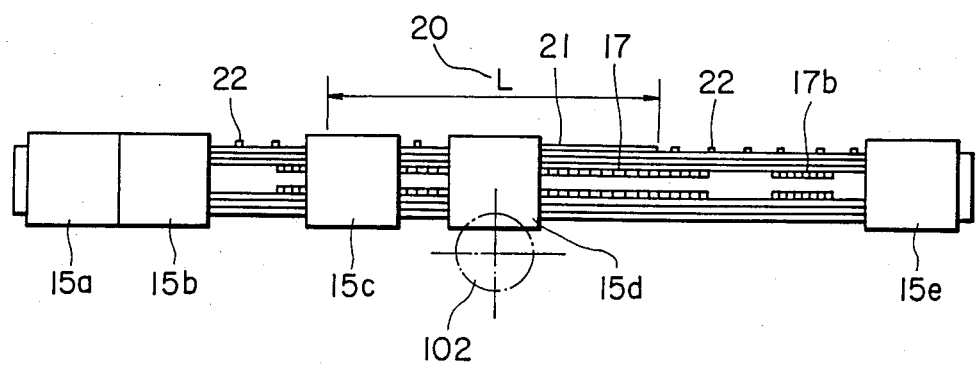
FIG. 4 is a plan view showing the component feeding apparatus in detail.

As will be seen from the above explanation, the high-accuracy high-speed positioning operation is required only for the part 1 m long designated by L near the transfer mechanism 102, and therefore the drive mechanism can be simplified as shown in FIG. 4. Specifically, in the areas other than part L designated by 20, the high-speed, high-accuracy positioning is not required and therefore the magnets 17b of the magnets, the coercive forces of which are smaller than that of the center portion, are arranged intermittently, so that the drive in the areas is partially obtained from inertia. The position of detecting mechanism for the positioning work, on the other hand, includes a high-resolution linear scale 21 only in the area associated with the part L designated by 20, while in the areas other than L, proximity switches 22 are arranged at intervals, or linear scales having low resolutions are arranged to detect the position of each table. Numeral 23 designates a linear scale head disposed in opposed relationship with the linear scale on the table side. The high resolution linear scale, shown schematically at 21 in FIG. 3, can be a conventional linear scale such as an optical linear scale or a magnetic type linear scale.

Figure 5:
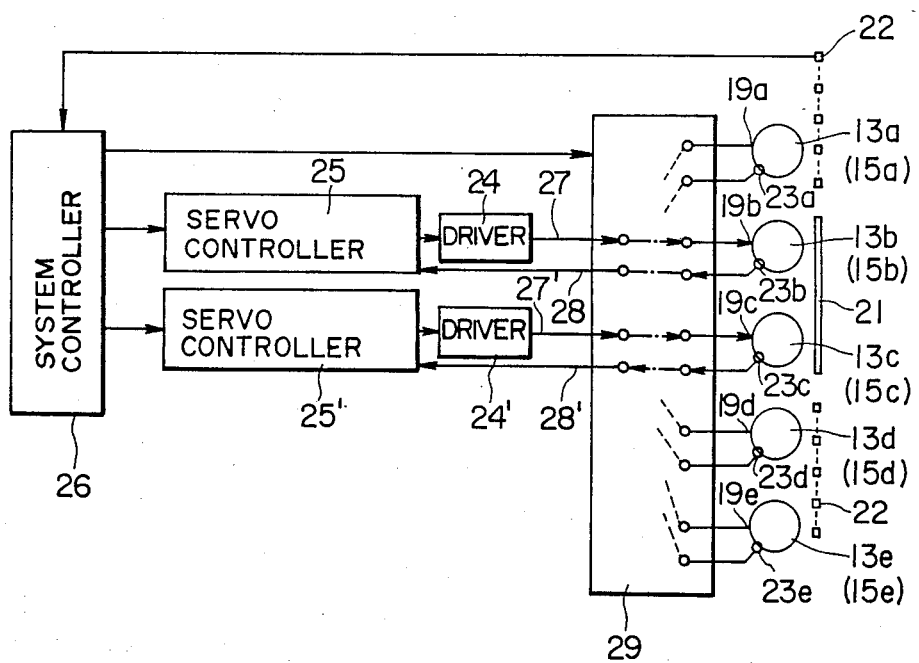
FIG. 5 is a diagram showing a configuration of a control unit.

A control unit according to the embodiment under consideration will be explained with reference to FIG. 5.

At least two sets of a driver 24 and a servo controller 25 are provided for a plurality of the linear motors 13a, 13b, 13c, 13d and 13e for a plurality of tables 15a to 15e. A system controller 26 is provided above the servo controller 25. A switch 29 for switching the drive circuit 27 and the position detection circuit 28 is inserted between the driver 24 and each of the linear motors 13a to 13e for the tables. Specifically, the drive circuit 27 is switched to the connection of the coils 19a to 19e of the tables, and the position detection circuit 28 is switched to the heads 23 (23a to 23e) of the linear scale.

Figure 6:
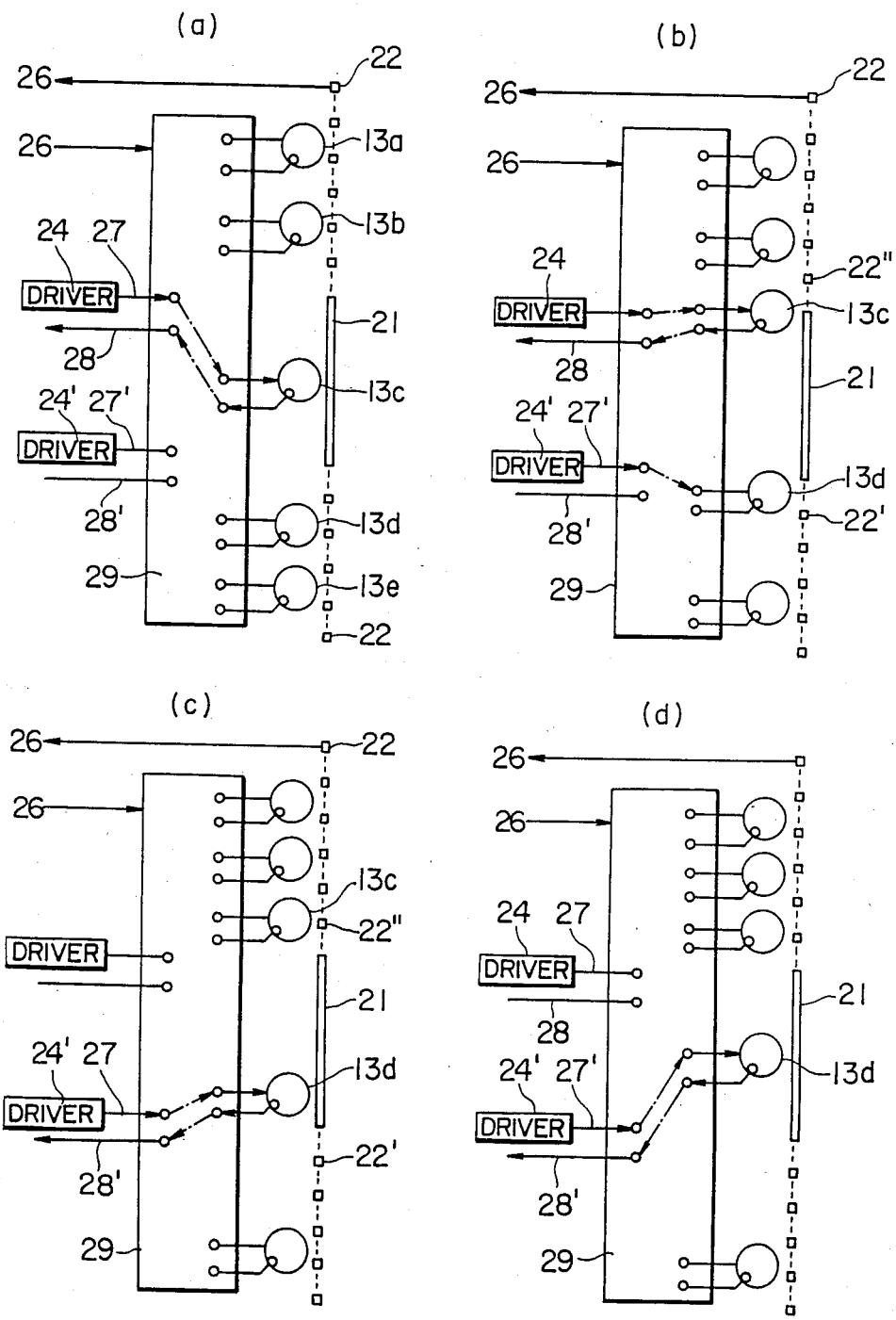
FIG. 6 is a diagram for explaining the operation of the control unit, of which the diagrams (a), (b), (c) and (d) illustrate the sequence of operation.
Figure 7:
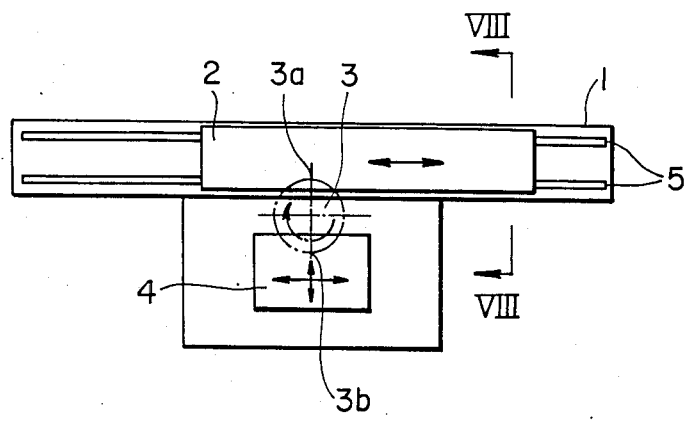
FIG. 7 is a plan view showing a component mounting apparatus comprising a conventional components supply apparatus.
Figure 8:
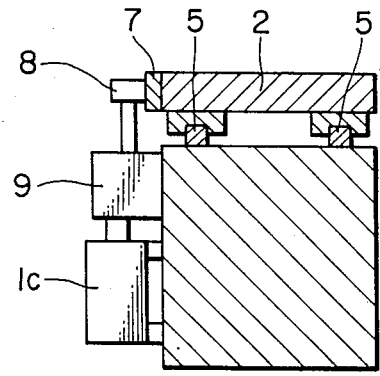
FIG. 8 is an enlarged sectional view taken in line VIII—VIII in FIG. 7.

The functions of the control unit and the resulting operation of the tables will be explained with reference to FIGS. 6 (a), (b), (c) and (d) in that order.

FIG. 6(a) shows the case in which the linear motor 13c loaded with the part as designated by the system controller 26 is driven by the driver 24 to reach a point just under the transfer mechanism 102 until the deviation of the servo controller 25 becomes zero. In this state, the drive circuit 27 and the position detection circuit 28 are connected by the switch 29, and the linear scale 21 is used for positioning as the high-precision positioning operation is involved. The linear motors 13a, 13b, 13d and 13e for the other tables 15a, 15b, 15d and 15e are kept at the ends of the body base, and the drive circuit 27 and the position detection circuit 28 thereof are not connected nor is the driver 24' used. Upon issuance of a command for using the part placed on the table 15d from the system controller 26 at the next moment, the linear motor 13c of the table 15c that has thus far conducted the work of transferring the part is moved to the opposite side of the table 15d in response to the signal from the system controller 26 as shown by FIG. 6(b), and at the same time, the drive circuit 27' of the driver 24' of the switch 29 is connected to the linear motor 13d. As a result, the linear motor 13d begins to move toward the transfer head at the center of the apparatus and when it passes the promixity switch 22' nearest to the linear scale 21 or passes the specific position of the low resolution linear scale, the command is transmitted to the system controller 26, thereby connecting the position detection circuit 28' by the switch 29 as shown in FIG. 6(c). The linear motor 13c of the table 15c, on the other hand, when it passes the proximity switch 22" or the like on the opposite side of the proximity switch 22' or the like, is disconnected with the position detection circuit 28, and when it comes to a predetermined position, is further disconnected with the driver circuit 27.

Then, as shown in FIG. 6(d), the linear motor 13d of the table 15d is driven by the commands of the system controller and, stopping at the predetermined position, conducts the components transfer work through the transfer mechanism. This state is the same as that of the linear motor 13c shown in FIG. 6(a). However, the driver 24, the drive circuit 27 and the detection circuit 28 are open, so that the circuits 27 and 28 are used for the next switching of the operation of the tables. The switching operation is performed in this way, thereby making it possible to perform the driving and positioning operation with a fewer number of drivers and circuits than the linear motors.

Though the switching operation is carried out by high-speed and high-accuracy positioning only one divided table, as described with reference to FIG. 5, two divided tables can be positioned simultaneously by using two drivers at high-speed and high-accuracy positioning.

Each table is loaded with 20 to 30 types of small electronic parts which are transferred at high speed to the board. Therefore, the switching is operated not to jump to the next table but one or any further table but always to the adjacent table for part transfer work.

Of the plurality of tables, those tables depleted of the electronic component are kept stationary on the sides of the body base, and in this state, the electronic components are supplied to them. Even during this component supplementing work, the electronic components continue to be transferred from the table positioned at the center to the printed board through the transfer mechanism. In this way, the apparatus performs the components-supplementing work by supplying the electronic component to the component feeding tables while the apparatus is in operation.

It will thus be understood from the foregoing description that according to the present invention there is provided a component feeding apparatus in which of all the plurality of tables, only the table which is engaged in the transfer work of the electronic components through the transfer mechanism is moved to position at high speed while the other tables are kept stationary, and therefore the weight of the moving components made up of the tables is reduced to less than one fourth of the conventional apparatus, thereby reducing the force, vibration or noise generated in the components of the apparatus for an improved performance and strength.

We claim:

1. In an electronic component mounting machine comprising a component feeding apparatus including a feeding table unit loaded with several types of electronic components which feeding table unit is reciprocated laterally on a base, and stopped at a predetermined position for feeding said components continuously to a transfer mechanism, a transfer mechanism for conveying said electronic components from said feeding table unit to a board on an X-Y table and mounting them on said board, the X-Y table fixing and stopping the board at a predetermined position, and a board transport apparatus for transporting said board onto the X-Y table, wherein said feeding table unit of said component feeding apparatus is divided into a plurality of feeding tables each moved individually on a single straight line by a drive means, said drive means moving and positioning said tables separately to a predetermined position in opposed relationship with the transfer mechanism in response to a command from a control unit.

2. A component feeding machine according to claim 1, wherein said drive means is made up of a linear motor including a stationary part having a couple of magnets arranged along a straight line in spaced relationship with each other and a moving part having a coil protruded downward from one of said tables and inserted in the space between the magnets.

3. A component feeding machine according to claim 2, wherein said magnets are arranged closely in proximity to said transfer mechanism and with greater intervals at other positions more remote from said transfer mechanism, or magnets having high coercive force are arranged closely to said transfer mechanism and magnets having low coercive force are arranged at other positions more remote from said transfer mechanism.

4. A component feeding machine according to claim 1, wherein said drive means for moving and positioning said tables includes a linear scale of high resolution in the vicinity of the transfer mechanism and a proximity switch or a low resolution linear scale at the other positions more remote from said transfer mechanism.

5. A component feeding machine according to claim 4, wherein said control unit includes a system controller, a plurality of drive circuits, linear scale detection circuits, drivers and servo controllers fewer in number than said tables, said proximity switch or said low resolution linear scale detecting a table approaching the region covered by the high resolution linear scale thereby to switch the connections of said drive circuits and said linear scale detection circuits to said tables simultaneously.

6. A component feeding machine according to claim 1, wherein each table includes a component storage unit installed thereon for sequentially delivering the components, thereby forming a component feeding apparatus including a transfer mechanism for conveying the components on the table to the board and an X-Y table having said board disposed thereon for placing said board at a predetermined position two-dimensionally.

7. An electronic component feeding apparatus for an electronic component mounting machine, comprising a supply table divided into a plurality of tables having several types of electronic components mounted thereon, a drive means for moving each table on the same straight line separately and for placing each table at a predetermined position on said line which is opposed to a transfer mechanism in response to a command from a control unit, the tranfer mechanism conveying said electronic components from said tables to a board placed on an X-Y table and mounting said components on said board, the X-Y table fixing and stopping the board at a predetermined position, and a board transport section for transporting said board on said X-Y table and delivering the board having the electronic components mounted thereon.

* * * * *